US005414272A

United States Patent [19]
Watanabe et al.

[11] Patent Number: 5,414,272
[45] Date of Patent: May 9, 1995

[54] SEMICONDUCTOR ELECTRON EMISSION ELEMENT

[75] Inventors: Nobuo Watanabe, Gotenba; Masahiko Okunuki, Tokyo; Takeo Tsukamoto, Atsugi, all of Japan

[73] Assignee: Canon Kabushiki Kaisha, Tokyo, Japan

[21] Appl. No.: 224,192

[22] Filed: Apr. 7, 1994

Related U.S. Application Data

[63] Continuation of Ser. No. 774,249, Oct. 10, 1991, abandoned.

[30] Foreign Application Priority Data

Oct. 13, 1990 [JP] Japan .................................. 2-273911
Sep. 27, 1991 [JP] Japan .................................. 3-249214

[51] Int. Cl.$^{6}$ ...................... H01L 29/48; H01L 29/56; H01L 29/64
[52] U.S. Cl. ....................................... 257/10; 257/475
[58] Field of Search .......................... 357/13, 15, 30 C; 257/10, 11, 475

[56] References Cited

U.S. PATENT DOCUMENTS 4,259,678 3/1981 Van Gorkom et al. .............. 357/13
4,303,930 12/1981 Van Gorkom et al. .............. 357/13
4,506,284 3/1985 Shannon ................................ 257/10
4,516,146 5/1985 Shannon et al. ....................... 257/10

FOREIGN PATENT DOCUMENTS 0331373 6/1989 European Pat. Off. .
0416626 3/1991 European Pat. Off. .
01220328 9/1989 Japan .............................. H01J 1/32

*Primary Examiner*—Sara W. Crane
*Attorney, Agent, or Firm*—Fitzpatrick, Cella, Harper & Scinto

[57] ABSTRACT

A semiconductor element emission element having a Schottky junction in a surface region of a semiconductor, comprises a first region having a first carrier concentration, a second region having a second carrier concentration, and a third region having a third carrier concentration. All of the regions are located below an electrode forming the Schottky junction. The first, second, and third carrier concentrations satisfy a condition that the first carrier concentration of the first region is higher than the second carrier concentration of the second region and that the second carrier concentration of the second region is higher than the third carrier concentration of the third region. The first, second, and third regions have a structure that at least one second region having the second carrier concentration is located inside the third region of the third carrier concentration, and that at lease one first region having the first carrier concentration is located inside said second region having the second carrier concentration.

16 Claims, 7 Drawing Sheets

SEMICONDUCTOR ELECTRON EMISSION ELEMENT

This application is a continuation of application Ser. No. 07/774,249 filed Oct. 10, 1991, now abandoned.

BACKGROUND OF THE INVENTION

1. Field of the Invention

The present invention relates to a semiconductor electron emission element.

2. Related Background Art

Conventional semiconductor electron emission elements, elements using avalanche amplification mechanisms are described in U.S. Pat. Nos. 4,259,678 and 4,303,930. In such a semiconductor electron emission element, p- and n-type semiconductor layers are formed on a semiconductor substrate, and cesium or the like is deposited on the surface of the n-type semiconductor layer to decrease a work function of the surface, thereby forming an electron emission portion. A reverse bias voltage is applied across two ends of a p-n junction formed by the p- and n-type semiconductor layers to cause avalanche amplification, so that electrons are converted into hot electrons. These hot electrons are emitted from the electron emission portion to the surface of the semiconductor substrate in a direction perpendicular to the surface of the semiconductor substrate.

As disclosed in Japanese Laid-Open Patent Application No. 1-220328, a Schottky barrier junction is formed by a p-type semiconductor and a metal material or a p-type semiconductor and a metal compound, and a reverse bias voltage is applied across two ends of this Schottky barrier junction to cause avalanche amplification, thereby converting electrons into hot electrons. These hot electrons are emitted from the electron emission portion to the surface of the semiconductor substrate in a direction perpendicular to the surface of the semiconductor substrate.

In each conventional semiconductor electron emission element described above, when the reverse bias voltage is applied across the two ends of the p-n or Schottky junction, avalanche breakdown occurs in the high-concentration p-type semiconductor region in which a depletion layer has the smallest width. Electrons having high energies and formed in this p-type semiconductor region are emitted from the solid surface to the outside. However, the shape of the depletion layer around the p-n or Schottky barrier junction has a radius of curvature determined by the application voltage and the carrier concentration of the p-type semiconductor. Therefore the electric field in the p-type semiconductor region becomes intense. Breakdown occurs in the p-n or Schottky barrier junction at a voltage lower than that causing the avalanche breakdown in the high-concentration p-type region, thereby degrading the characteristics of the element. It is possible to decrease the carrier concentration of the p-type semiconductor at the p-n or Schottky barrier junction and hence increase the radius of curvature around the depletion layer, thereby suppressing breakdown therein. However, the resistance value between an electrode for supplying electrons and the high-concentration p-type semiconductor region which causes the avalanche breakdown is then increased. A voltage drop and generation of Joule's heat occur in this high-resistance region. In a conventional element, in order to increase the radius of curvature around this depletion layer to prevent breakdown therein, a guard ring made of an n-type semiconductor is required. In a conventional element structure, a ring-like n-type semiconductor region is formed to have a high impurity concentration, so that a process such as ion implantation or thermal diffusion, which takes a long period of time to increase the amount of a dopant, are required. In addition, since a voltage is applied to the guard ring made of a high-concentration n-type semiconductor, an ohmic contact electrode must be formed on the guard ring so as to achieve excellent ohmic contact with the n-type semiconductor.

SUMMARY OF THE INVENTION

In order to achieve an object of the present invention, the following means is implemented. A region having a carrier concentration lower than that of a p-type semiconductor constituting a Schottky barrier junction is formed to surround the p-type semiconductor. In general, the width of a depletion layer formed upon application of a reverse bias voltage to the Schottky barrier junction of the semiconductor is increased when the carrier concentration of the semiconductor is decreased. When the Schottky barrier junction is surrounded by the semiconductor having a low impurity concentration, it is possible to increase the radius of curvature around the depletion layer. When a voltage is applied to cause avalanche breakdown in the high-concentration p-type semiconductor region located at the center of the radius of curvature, it is possible to prevent breakdown in the peripheral area of the high-concentration p-type semiconductor region. Although a guard ring made of a high-concentration n-type semiconductor is conventionally used to suppress the breakdown in the peripheral region of this Schottky barrier junction, breakdown in this region can be prevented without requiring such a guard ring in the present invention. In addition, in a multiple electron emission element having a plurality of high-concentration p-type semiconductor regions for emitting electrons, after a high-concentration p-type semiconductor for supplying electrons is formed, a layer serving as the semiconductor region having the low carrier concentration is epitaxially grown. A high-concentration p-type semiconductor region for causing the avalanche breakdown and a p-type semiconductor region located around this high-concentration p-type semiconductor region and serving as a path for supplying the electrons thereto are formed in the semiconductor layer having the low carrier concentration in accordance with ion implantation. The manufacturing process can become simpler than the conventional manufacturing process. In addition, since the guard ring of the n-type semiconductor is not required, a plurality of elements can be arranged at a high density.

According to the present invention, low-voltage breakdown occurring around the depletion layer of the p-n or Schottky barrier junction during operation of the element can be prevented by the semiconductor region having the low carrier concentration. The guard ring made of a high-concentration n-type semiconductor required in the conventional element can be omitted. Therefore, the manufacturing process of the element can be simplified, and the size of the element can be reduced. In addition, the element density of the multiple element can be increased.

The semiconductor region having the low carrier concentration, used in the present invention, preferably has a carrier concentration 1/10 or less than that of the p-type semiconductor.

DETAILED DESCRIPTION OF THE PREFERRED EMBODIMENTS

Figure 1A:
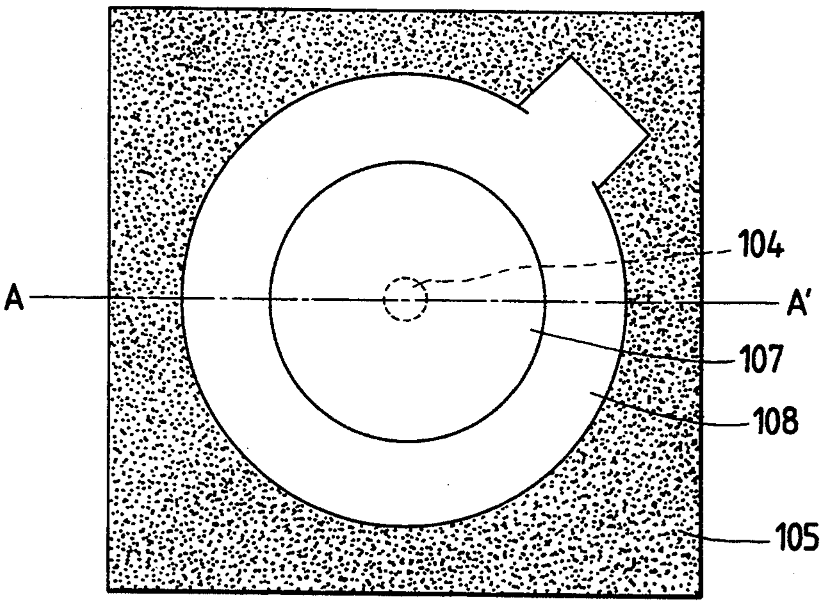
FIGS. 1A and 1B are a plan view and a sectional view, respectively, showing a semiconductor electron emission element according to the first embodiment of the present invention.
Figure 1B:
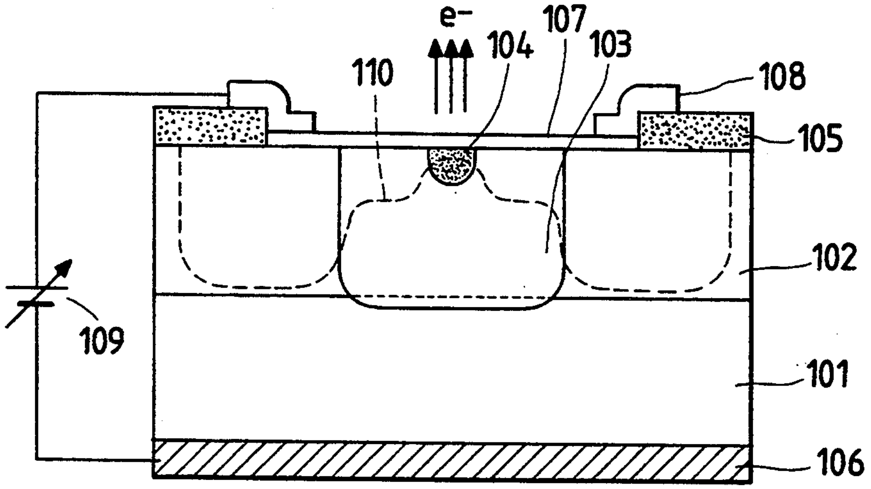
Figure 2:
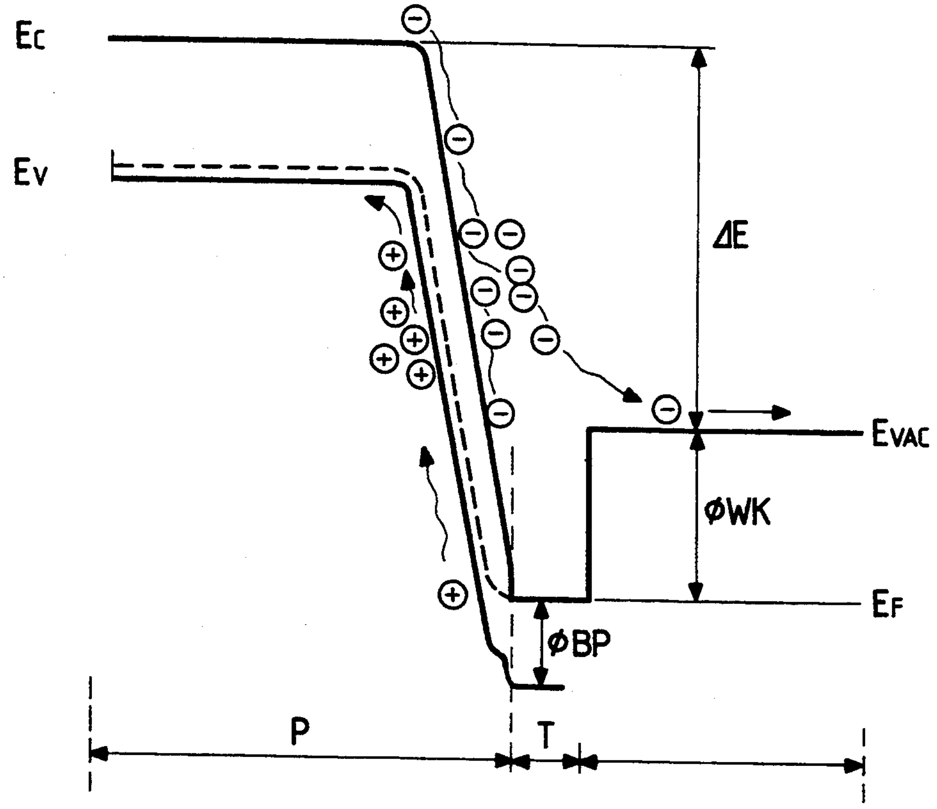
FIG. 2 is a band diagram for explaining the principle of operation of the element of the present invention.

The principle of operation of a semiconductor electron emission element according to the present invention will be described with reference to FIGS. 1A to 2. Referring to FIGS. 1A and 1B, in principle, a semiconductor material can be selected from Si, Ge, GaAs, GaP, AlAs, GaAsP, AlGaAs, SiC, BP, AlN, and diamond. In particular, an indirect transition type material having a large bandgap is preferable as the material. The present invention is characterized in that low-voltage breakdown around a p-type semiconductor layer 103 which surrounds a high-concentration p-type semiconductor region 104 associated with electron emission due to avalanche amplification (to be described later) can be prevented not by the conventional high-concentration n-type semiconductor guard ring but by a region 102 having a low carrier concentration. As a method of forming the region 103 having a low carrier concentration, there are available a method using a low-concentration epitaxial layer as described above, and a method of doping Si ions serving as an n-type impurity in the p-type semiconductor layer at a concentration almost equal to the p-type carrier concentration of this p-type semiconductor, thereby canceling the carriers to form the region having the low carrier concentration. A material for an electrode 107 can be any material, such as Al, Au, or $LAB_6$, which is known to form a Schottky barrier junction with the p-type semiconductor, in addition to W. Since electron emission efficiency is increased when the work function of the surface of this electrode is low, a low work function material such as Cs is formed on the surface to have a small thickness to improve the electron emission efficiency if the work function of a material used is high.

The electron emission process in the semiconductor electron emission element will be described with reference to FIG. 2. When a reverse bias voltage is applied to a Schottky diode which forms a Schottky barrier junction with a p-type semiconductor, a bottom Ec of the conduction band of the p-type semiconductor becomes an energy level higher than a vacuum level Evac of an electrode which forms the Schottky barrier. Electrons generated by avalanche amplification receive energy higher than that of a lattice temperature by an electric field in a depletion layer formed at the interface between the semiconductor and the metal electrode. The electrons are injected into the electrode which forms the Schottky barrier junction. The electrons having a higher energy than that of the work function of the surface of the electrode which forms the Schottky barrier junction are emitted in the vacuum. Therefore, a decrease in the work function of the surface of the electrode causes an increase in electron emission amount.

First Embodiment

FIGS. 1A and 1B are schematic views showing a semiconductor electron emission element according to an embodiment of the present invention. More specifically, FIG. 1A is a plan view of the element, and FIG. 1B is a sectional view along a line A—A' in FIG. 1A. This semiconductor electron emission element includes a high-concentration p-type semiconductor substrate 101, a p-type semiconductor layer 102 as a characteristic feature of the present invention having a lower carrier concentration than that of a p-type semiconductor region 103 and surrounding the p-type semiconductor region 103, a high-concentration p-type semiconductor region 104 which causes avalanche amplification, an insulating film 105, an electrode 106 in ohmic contact with the p-type semiconductor, a metal electrode 107 for forming a Schottky barrier junction, an electrode 108, a power source 109, and a depletion layer 110 formed upon actual electron emission and obtained by calculation.

The manufacturing process of the semiconductor emission element shown in FIGS. 1A and 1B will be described below.

(1) A Be-doped p-type GaAs semiconductor layer 102 having a carrier concentration of $1\times10^{14}\,cm^{-3}$ was grown on a Zn-doped GaAs semiconductor substrate 101 having a carrier concentration of $5\times10^{18}\,cm^{-3}$ in accordance with an MBE (Electron Beam Epitaxy) method.

(2) Be ions were implanted in a p-type semiconductor region 103 up to the high-concentration p-type semiconductor substrate 101 so as to obtain an almost uniform carrier concentration of $2\times10^{16}\,cm^{-3}$ in accordance with an FIB (Focused Ion Beam) injection method. Be ions were further implanted to have a carrier concentration of $2\times10^{18}\,cm^{-3}$ in accordance with the FIB implantation method to form a high-concentration p-type semiconductor region 104. Upon completion of these implantation steps, the resultant structure was annealed at 850° C. for 10 seconds to activate the implanted portion.

(3) $SiO_2$ was vacuum-deposited as an insulating film 105, and a contact hole was formed by conventional photolithography. Au/Cr was deposited on the lower surface of the high-concentration p-type GaAs semiconductor substrate 101. Annealing was performed at 400° C. for 5 minutes to form an ohmic contact electrode 107.

(4) W was selected as a material for forming a Schottky barrier Junction with the p-type GaAs semiconductor. A W electrode 106 having a thickness of 8 nm was formed by electron beam deposition. Al was deposited and patterned in accordance with conventional photolithography to form an electrode 108.

The resultant semiconductor electron emission electrode (FIG. 1) was placed in a vacuum chamber kept at a vacuum of $1\times10^{-7}$ Torr, and a reverse bias voltage of 5 V was applied from the power source 109 to the element. Electron emission of about 0.1 nA was observed from the W surface as the upper portion of the high-concentration p-type semiconductor region. This element had almost the same current-voltage characteristics as those of the conventional element in which the region 102 having the low carrier concentration was replaced with the guard ring of the high-concentration n-type semiconductor. The electron emission characteristics of the element of the present invention with respect to application voltages were the same as those of the conventional one. A state of the depletion layer during electron emission is calculated as indicated by a broken line 110. As is apparent from the shape of the depletion layer, the peripheral portion of the Schottky barrier junction does not have a depletion layer end with a sectional shape having a small radius of curvature which causes breakdown upon application of a low voltage. Therefore, the conventional guard ring of the high-concentration n-type semiconductor can be eliminated by the region 102 having the low carrier concentration according to the present invention.

Second Embodiment

Figure 3A:
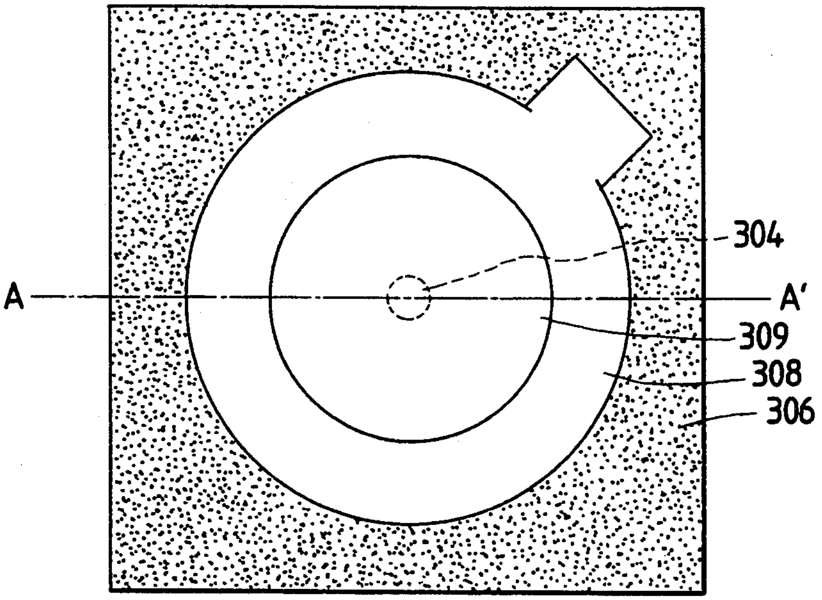
FIGS. 3A and 3B are a plan view and a sectional view, respectively, showing an electron emission element using a p-n junction of a GaAs semiconductor according to the second embodiment of the present invention.
Figure 3B:
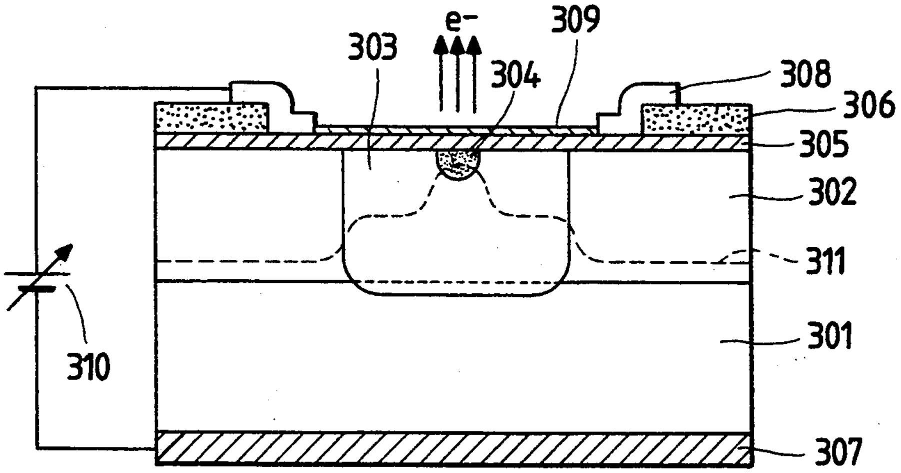

FIGS. 3A and 3B are schematic views showing a semiconductor electron emission element having a p-n junction according to the second embodiment of the present invention, in which FIG. 3A is a plan view thereof, and FIG. 3B is a sectional view thereof along the line A—A' of FIG. 3A. This semiconductor electron emission element comprises a high-concentration p-type semiconductor substrate 301, a p-type semiconductor layer 302 as a characteristic feature of the present invention having a carrier concentration lower than that of a p-type semiconductor region 303 and surrounding the p-type semiconductor region 303, a high-concentration p-type semiconductor region 304 for causing avalanche amplification, a high-concentration n-type semiconductor layer 305 forming p-n junctions with the p-type semiconductor layer 302, the p-type semiconductor layer 303, and the p-type semiconductor region 304, an insulating film 306, an electrode 307 in ohmic contact with the p-type semiconductor substrate 301, an electrode 308 in ohmic contact with the high-concentration n-type semiconductor layer 305, a thin film 309 of a low work function material for increasing electron emission efficiency, a power source 310, and a depletion layer 311 formed upon actual electron emission and obtained by calculation.

The steps in manufacturing the semiconductor electron emission element shown in FIGS. 3A and 3B will be described below.

(1) A Be-doped p-type GaAs semiconductor layer 302 having a carrier concentration of $1\times10^{14}$ cm$^{-3}$ was grown on a Zn-doped GaAs semiconductor substrate 301 having a carrier concentration of $5\times10^{18}$ cm$^{-3}$ in accordance with an MBE (Electron Beam Epitaxy) method.

(2) Be ions were implanted in a p-type semiconductor region 303 up to the high-concentration p-type semiconductor substrate 301 so as to obtain an almost uniform carrier concentration of $2\times10^{16}$ cm$^{-3}$ in accordance with an FIB (Focused Ion Beam) injection method. Be ions were further implanted to have a carrier concentration of $2\times10^{18}$ cm$^{-3}$ in accordance with the FIB implantation method to form a high-concentration p-type semiconductor region 304. Upon completion of these implantation steps, the resultant structure was annealed at 850° C. for 10 seconds to activate the implanted portion.

(3) Si ions were doped to form a high-concentration n-type semiconductor layer 305 in accordance with the MBE method so as to obtain a carrier concentration of $1\times10^{19}$ cm$^{-3}$, thereby forming a 0.01-μm thick high-concentration n-type GaAs layer.

(4) $SiO_2$ was vacuum-deposited as an insulating film 306, and a contact hole was formed by conventional photolithography. Au/Cr was deposited on the lower surface of the high-concentration p-type GaAs semiconductor substrate 301. Annealing was performed at 400° C. for 5 minutes to form an ohmic contact electrode 307. An Au/Au-Ge alloy was patterned by a lift-off method using a conventional photoresist to form an electrode 308 in ohmic contact with the high-concentration n-type GaAs layer 305.

(5) Cs (cesium) was selected as the low work function material and was deposited to a thickness corresponding to a single atomic layer, thereby obtaining a thin film 309 of the low work function material.

The resultant semiconductor electron emission electrode was placed in a vacuum chamber kept at a vacuum of $1\times10^{-9}$ Torr, and a reverse bias voltage of 6 V was applied from the power source 310 to the element. Electron emission of about 10 nA was observed from the Cs surface as the upper portion of the high-concentration p-type semiconductor region. This element had almost the same current-voltage characteristics as those of the conventional element in which the region 302 having the low carrier concentration was replaced with the guard ring of the high-concentration n-type semiconductor. The electron emission characteristics of the element of the present invention with respect to application voltages were the same as those of the conventional one. A state of the depletion layer during electron emission is calculated as indicated by a broken line 311. As is apparent from the shape of the depletion layer, the peripheral portion of the p-n junction does not have a depletion layer end with a sectional shape having a small radius of curvature which causes breakdown upon application of a low voltage. Therefore, the conventional guard ring of the high-concentration n-type semiconductor can be eliminated by the region 302 having the low carrier concentration according to the present invention.

Third Embodiment

Figure 4A:
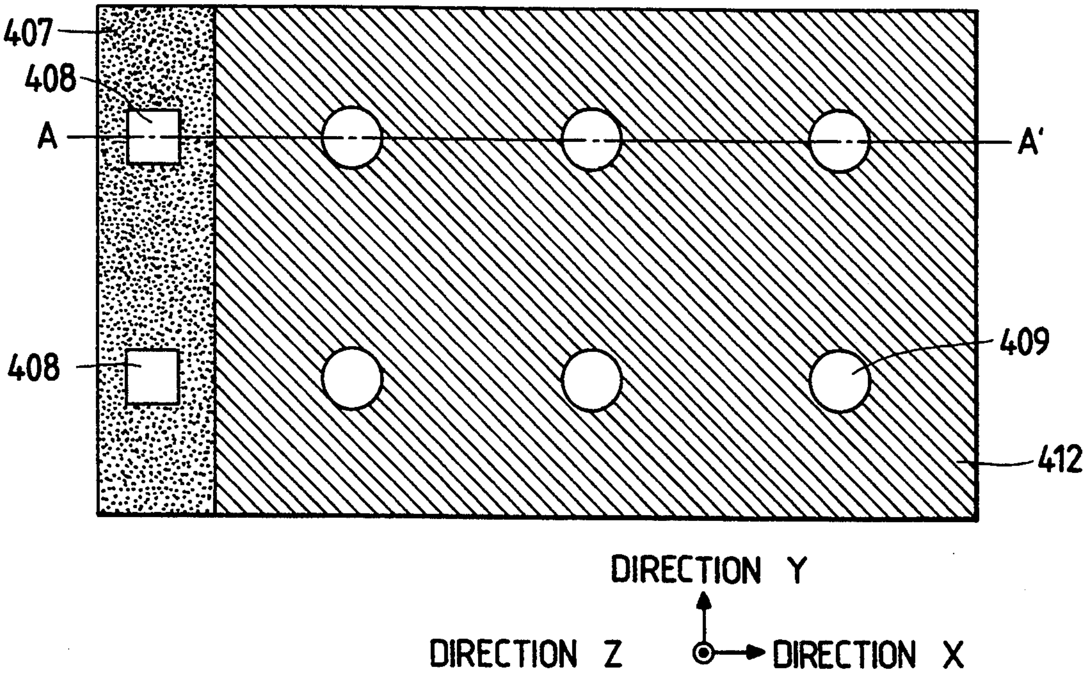
FIGS. 4A and 4B are a plan view and a sectional view, respectively, showing a multiple semiconductor electron emission element according to the third embodiment of the present invention.
Figure 4B:
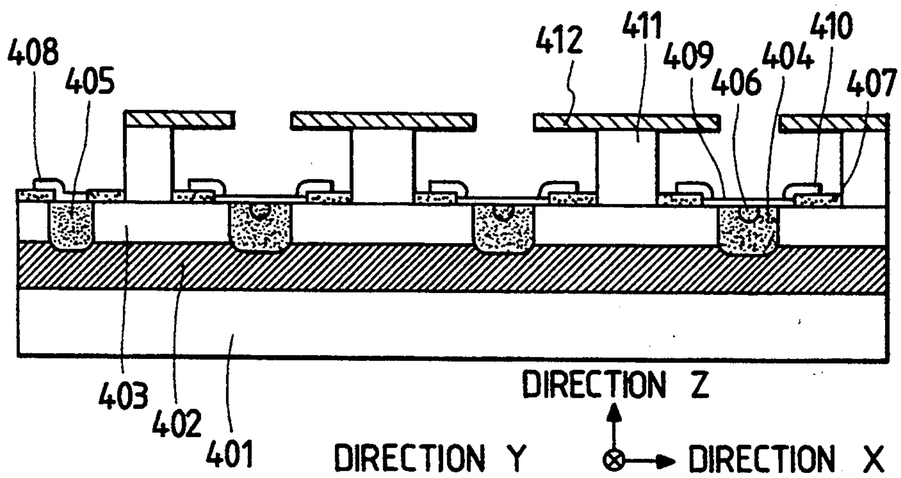

FIGS. 4A and 4B are schematic views showing a multiple electron emission element having a plurality of semiconductor electron emission elements arranged on a single substrate in a matrix form according to the third embodiment of the present invention, in which FIG. 4A is a plan view thereof, and FIG. 4B is a sectional view thereof along the line A—A' of FIG. 4A. This electron emission element comprises a high-resistance GaAs semiconductor substrate 401, a high-concentration p-type GaAs semiconductor region 402, a p-type GaAs semiconductor layer 403 having a carrier concentration of about $1\times10^{13}$ cm$^{-3}$, a p-type GaAs semiconductor region 404 having a carrier concentration of $1\times10^{16}$ $cm^{-3}$, a high-concentration p-type GaAs semiconductor region 405 reaching the p-type GaAs layer 402, a p-type GaAs semiconductor region 406 having a carrier concentration of $2\times10^{18}$ $cm^{-3}$, an insulating film 407, an Au/Cr electrode 408 in ohmic contact with the p-type GaAs, a thin W film 409 for forming a Schottky barrier junction with the p-type GaAs, an Al electrode 410, an insulating gate support member 411, and a metal film gate 412.

The steps in manufacturing the multiple electron emission electrode using the Schottky barrier junction shown in FIGS. 4A and 4B will be described below.

(1) Be ions were implanted in a semi-insulating GaAs semiconductor substrate 401 having a carrier concentration of $1\times10^{12}$ $cm^{-3}$ or less so as to obtain a carrier concentration of $5\times10^{18}$ $cm^{-3}$ or more in accordance with the FIB (Focused Ion Beam) method to form a stripe-like high-concentration p-type semiconductor region 402 extending in the X direction.

(2) A p-type GaAs semiconductor layer 403 was grown so as to have a carrier concentration of $1\times10^{13}$ $cm^{-3}$ or less in accordance with the MBE (Molecular Beam Epitaxy) method.

(3) Be ions were injected in a p-type GaAs semiconductor region 404 so as to have an almost uniform impurity concentration of $2\times10^{16}$ $cm^{-3}$ from the surface to the high-concentration p-type GaAs semiconductor layer 402 in accordance with the FIB method sequentially at acceleration voltages of 40 keV, 140 keV, and 200 keV. Similarly, Be ions were implanted in a high-concentration p-type semiconductor region 405 as in the region 404 so as to obtain a carrier concentration of $5\times10^{18}$ $cm^{-3}$ or more in accordance with the FIB method. In addition, Be ions were further implanted to obtain an impurity concentration of $2\times10^{18}$ $cm^{-3}$ in accordance with the FIB method, thereby forming a high-concentration p-type semiconductor region 406 which causes avalanche amplification.

The FIB steps and the MBE steps in steps (1) to (3) were performed without exposing the semiconductor wafers to the outer atmosphere because the FIB and MBE apparatuses were connected through a tunnel. When the above steps were completed, annealing was performed at 850° C. for 10 seconds, thereby activating the implanted portion.

(5) AlN (aluminum nitride) was vacuum-deposited as an insulating film 407, and an opening was formed by conventional photolithography.

(6) Au/Cr was vacuum-deposited on the high-concentration p-type semiconductor region 405, and annealing was performed at 400° C. for 5 minutes to form an ohmic contact electrode 408.

(7) W was selected as a material for forming a Schottky barrier junction with the p-type GaAs semiconductor, and an 8-nm thick W electrode 409 was formed by electron beam deposition. Al was vacuum-deposited and patterned by conventional photolithography to form an electrode 410.

(8) $SiO_2$ and W were sequentially vacuum-deposited and were patterned by conventional photolithography to form an insulating material support member 411 and a gate electrode 412, respectively.

A multiple semiconductor electron emission element having a matrix of 30 electron emission portions aligned in the X direction and 13 electron emission portions aligned in the Y direction and each manufactured as described above was placed in a vacuum chamber evacuated to a vacuum of $1\times10^{-7}$ Torr, and a reverse bias voltage of 7 V was applied to the element. Electron emission as a total of about 70 nA was confirmed. This element had almost the same current-voltage and electron emission characteristics as those of the conventional element having the guard ring of the n-type semiconductor.

In this element, as the region 403 having the low carrier concentration as the characteristic feature of the present invention, an MBE growth film of a p-type GaAs semiconductor having a carrier concentration of $1\times10^{13}$ $cm^{-3}$ or less was used. Since a large depletion layer is formed in such a semiconductor having a low carrier concentration upon application of a bias voltage, the radius of curvature of the depletion layer end, which causes low-voltage breakdown, can be increased. Therefore, breakdown around the Schottky barrier can be prevented.

Fourth Embodiment

Figure 5:
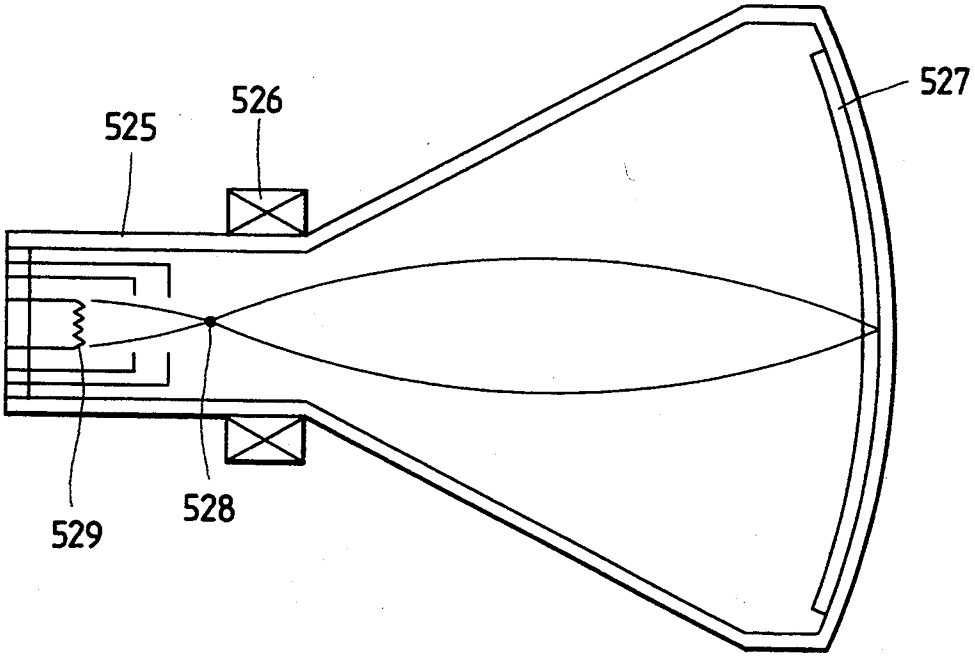
FIG. 5 is a sectional view showing a conventional CRT display.
Figure 6:
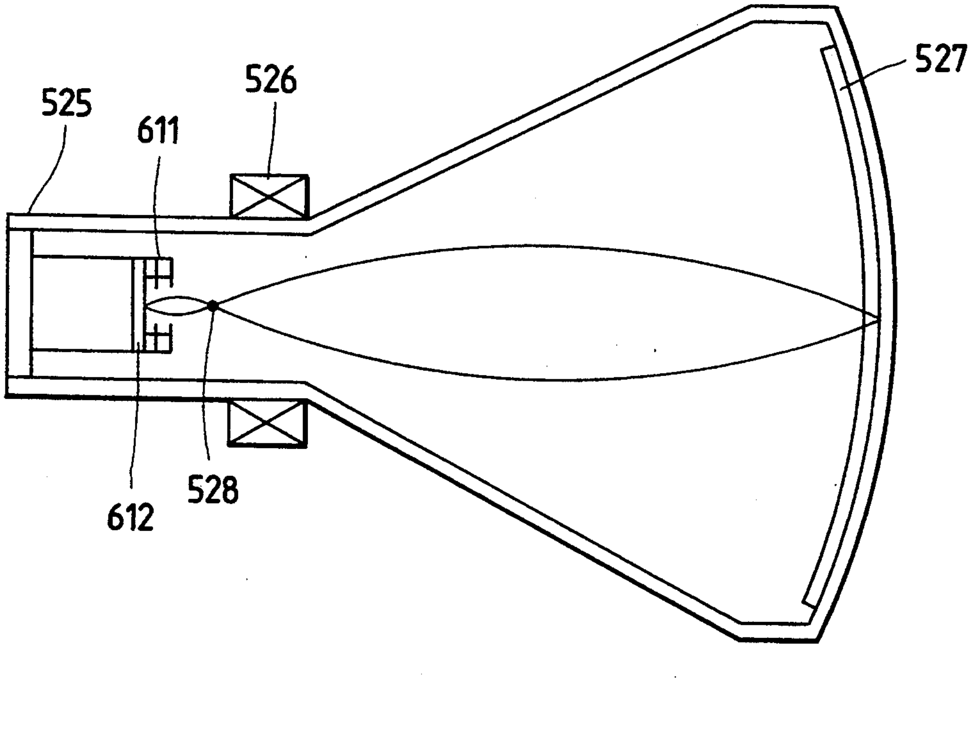
FIG. 6 is a sectional view showing an arrangement of a CRT display of a display apparatus according to the fourth embodiment of the present invention.

FIG. 6 shows a CRT display as a display apparatus according to the fourth embodiment of the present invention. FIG. 5 shows a conventional CRT display.

Each of the CRT display of the fourth embodiment and the conventional CRT display comprises a glass tube 525, a deflection coil 526 serving as an electron deflecting means, a phosphor screen 527, a cross-over point 528 of the emitted electron, and a hot electron source filament 529. This filament in FIG. 5 is replaced with an electron emission element 612 of the present invention in FIG. 6. In addition, a lens electrode 611 is located in FIG. 6 so as to obtain a cross-over point at the same position as in FIG. 5.

By using the electron emission element according to the present invention, a stable CRT having a long service life can be obtained.

Fifth Embodiment

Figure 7:
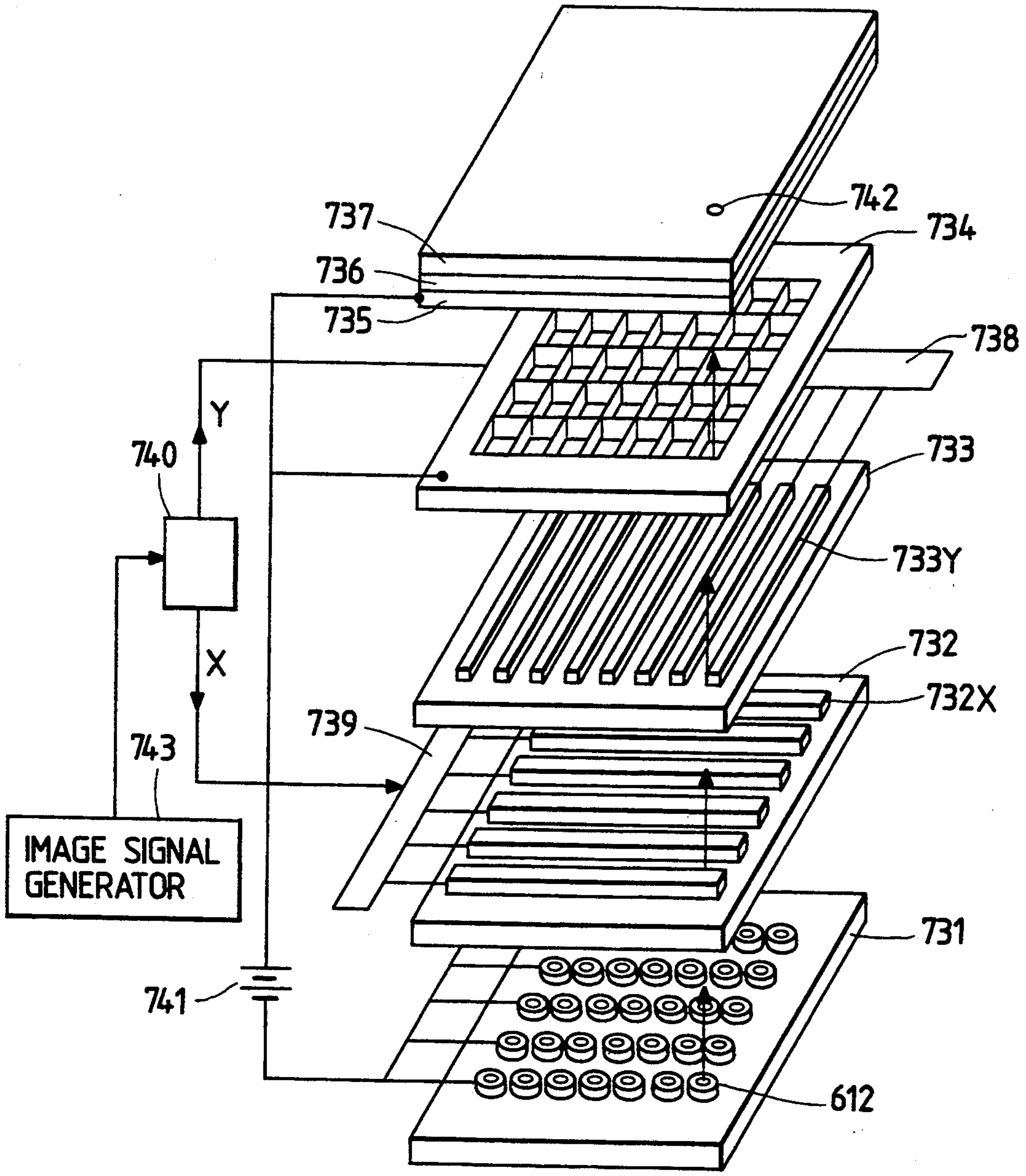
FIG. 7 is a view showing an arrangement of a flat display of the display apparatus according to the fifth embodiment of the present invention.

FIG. 7 shows a display apparatus according to the fifth embodiment of the present invention. This embodiment exemplifies a flat display electron source constituted by a substrate obtained by arranging a large number of electron emission elements of the present invention in a matrix form.

This display apparatus in FIG. 7 comprises a semiconductor substrate 731 having a large number of electron emission elements 612, X and Y control grid substrates 732 and 733 serving as X and Y address means having control grids $732_X$ and $732_Y$, an acceleration grid 734, a metal backing member 735, a phosphor 736, and a transparent glass panel 737. When an image signal 740 from an image signal generator 743 is input to a signal separator, the separator separates a display point (dot) into X and Y components, and X and Y addresses are input to address decoders 739 and 738, respectively, the potentials of the X and Y grids for the point to be displayed are changed in a direction to extract electrons from the electron emission element. An electron passes through the control grid substrates 732 and 733 and reaches the acceleration grid 734. A high voltage 741 is kept applied to the acceleration grid 734, so that the electron receives a high energy to cause emission from the phosphor 736, thereby obtaining a spot 742.

As described above, a large, thin display in place of a conventional CRT can be obtained with a very simple arrangement.

Sixth Embodiment

Figure 8:
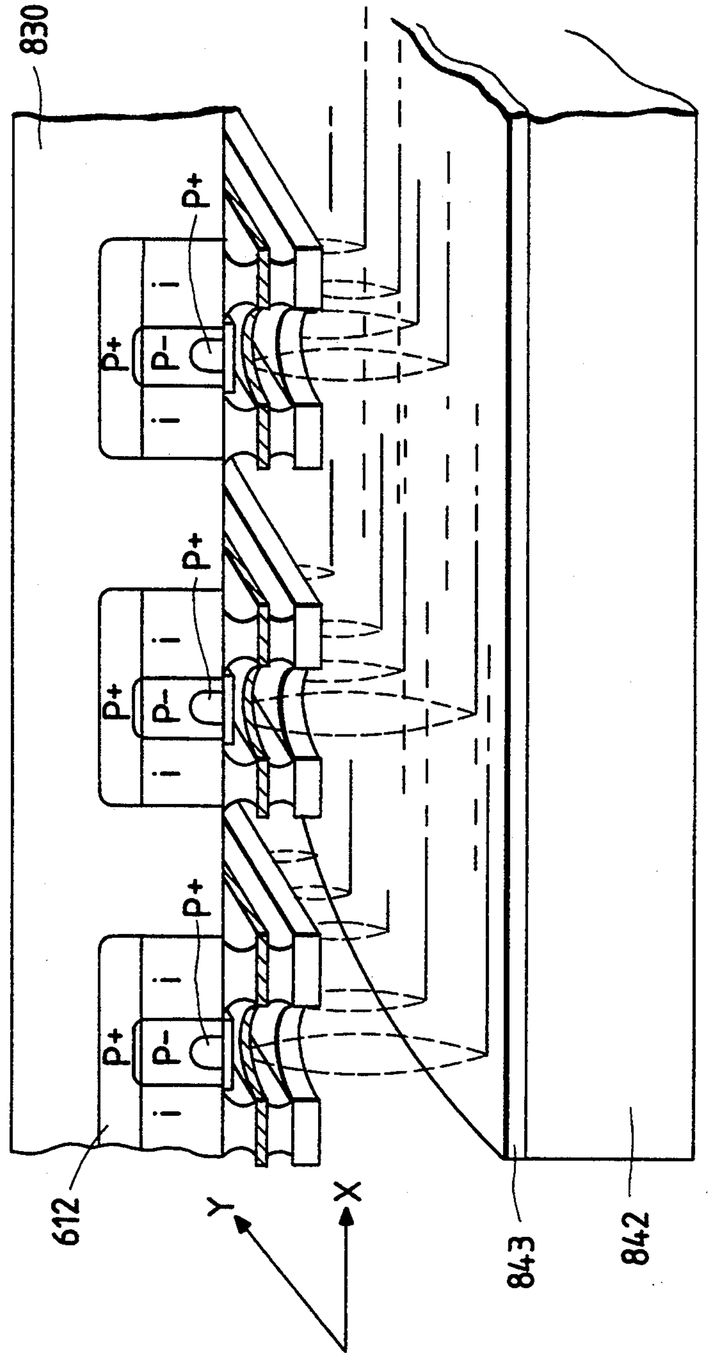
FIG. 8 is a view showing an arrangement of an electron beam drawing apparatus according to the sixth embodiment of the present invention.

FIG. 8 shows an electron beam drawing apparatus according to the sixth embodiment of the present invention. This apparatus includes a substrate 830 obtained by arranging electron emission elements 612 in a matrix form and draws a pattern in an electron beam drawing resist 843 applied to a resist substrate 842. The drawing ON/OFF state is analyzed by drawing data, and the resultant data is transmitted to the base-emitter path. When the data is to be drawn to the base-emitter path, the potential difference between the emitter and collector is changed to emit electrons. The electron beam is focused by a lens electrode 617 on the drawing resist 843, and the resist 843 is sensitized with the beam.

In this embodiment, since electron emission elements according to the present invention are used, a high-precision, compact, high-speed drawing system can be arranged.

According to the present invention, as has been described above, in a semiconductor electron emission element utilizing a p-n junction or a Schottky barrier junction, without using a guard ring of a high-concentration n-type semiconductor for preventing low-voltage breakdown around the Schottky barrier junction, the same element characteristics as those of the conventional element can be obtained. As compared with the conventional element, the manufacturing process can be simplified, and the element size can be reduced. In addition, the packing density of the multiple electron emission element can be increased.

What is claimed is:

1. A semiconductor electron emission element having a Schottky junction in a surface region of a semiconductor, comprising a first region having a first dopant concentration, a second region having a second dopant concentration, and a third region having a third dopant concentration, all of which are located below an electrode forming the Schottky junction, the first, second, and third dopant concentrations satisfying a condition that the first dopant concentration of the first region is higher than the second dopant concentration of the second region and the second dopant concentration of the second region is higher than the third dopant concentration of the third region, said first, second, and third regions having a structure that at least one second region having the second dopant concentration is located inside said third region of the third dopant concentration, and at least one first region having the first dopant concentration is located inside said second region having the second dopant concentration, and wherein said first and second regions comprise a p-type semiconductor, and said third region comprises a semiconductor selected from the group consisting of a p-type semiconductor, an n-type semiconductor, an undoped semiconductor, and a semi-insulating semiconductor.

2. An element according to claim 1, wherein said second and third regions are formed in contact with a high-concentration p-type semiconductor for supplying carriers, and said first region is separated from the high-concentration p-type semiconductor.

3. An element according to claim 1, wherein said first and second regions comprise a p-type semiconductor, and said third region comprises a semiconductor selected from the group consisting of a p-type semiconductor, an n-type semiconductor, an undoped semiconductor, and a semi-insulating semiconductor.

4. An element according to claim 1, wherein the second carrier concentration of said second region is not more than ½ the first carrier concentration, and the third carrier concentration is not more than 1/10 the first carrier concentration.

5. An element according to claim 1, wherein said first and second regions are formed by an ion implantation method.

6. An element according to claim 1, wherein said semiconductor electron emission element of claim 1 comprises a plurality of electron emission elements formed on a single substrate, and said plurality of electron emission elements are electrically separated from each other using said third region.

7. An element according to claim 1, wherein the first carrier concentration of said first region falls within a range of $5\times10^{17}$ cm$^{-3}$ to $5\times10^{18}$ cm$^{-3}$, the second carrier concentration of said second region falls within a range of $1\times10^{16}$ cm$^{-3}$ to $2\times10^{18}$ cm$^{-3}$, and the third carrier concentration of said third region falls within a range of $1\times10^{13}$ cm$^{-3}$ to $1\times10^{17}$ cm$^{-3}$.

8. An element according to claim 1, wherein said electrode forming the Schottky junction has a thickness of not more than 0.1 $\mu$m.

9. A semiconductor electron emission element having a p-n junction in a surface region of a semiconductor, comprising a first region having a first dopant concentration, a second region having a second dopant concentration, and a third region having a third dopant concentration, all of which are located below an uppermost semiconductor layer forming the p-n junction, the first, second, and third dopant concentrations satisfying a condition that the first dopant concentration of the first region is higher than the second dopant concentration of the second region and the second dopant concentration of the second region is higher than the third dopant concentration of the third region, said first, second, and third regions having a structure that at least one second region having the second dopant concentration is located inside said third region of the third dopant concentration, and at least one first region having the first dopant concentration is located inside said second region having the second dopant concentration, and wherein said uppermost semiconductor layer comprises an n-type semiconductor, said first and second regions comprise a p-type semiconductor, and said third region comprises a semiconductor selected from the group consisting of a p-type semiconductor, an n-type semiconductor, and undoped semiconductor, and a semi-insulating semiconductor.

10. An element according to claim 9, wherein said second and third regions are formed in contact with a high-concentration p-type semiconductor for supplying carriers, and said first region is separated from the high-concentration p-type semiconductor.

11. An element according to claim 9, wherein said uppermost semiconductor layer comprises an n-type semiconductor, said first and second regions comprise a p-type semiconductor, and said third region comprises a semiconductor selected from the group consisting of a p-type semiconductor, an n-type semiconductor, an undoped semiconductor, and a semi-insulating semiconductor.

12. An element according to claim 9, wherein the second carrier concentration of said second region is not more than ½ the first carrier concentration, and the third carrier concentration is not more than 1/10 the first carrier concentration.

13. An element according to claim 9, wherein said first and second regions are formed by an ion implantation method.

14. An element according to claim 9, wherein said semiconductor electron emission element of claim 9 comprises a plurality of electron emission elements formed on a single substrate, and said plurality of electron emission elements are electrically separated from each other using said third region.

15. An element according to claim 9, wherein the first carrier concentration of said first region falls within a range of $5\times10^{17}$ cm$^{-3}$ to $5\times10^{18}$ cm$^{-3}$, the second carrier concentration of said second region falls within a range of $1\times10^{16}$ cm$^{-3}$ to $2\times10^{18}$ cm$^{-3}$, and the third carrier concentration of said third region falls within a range of $1\times10^{13}$ cm$^{-3}$ to $1\times10^{17}$ cm$^{-3}$.

16. An element according to claim 9, wherein said uppermost semiconductor layer has a thickness of not more than 0.1 $\mu$m.

* * * * *

UNITED STATES PATENT AND TRADEMARK OFFICE
CERTIFICATE OF CORRECTION

PATENT NO. : 5,414,272
DATED : May 9, 1995
INVENTOR(S) : NOBUO WATANABE, ET AL.

It is certified that error appears in the above-identified patent and that said Letters Patent is hereby corrected as shown below:

ON TITLE PAGE

In [56] References Cited, under FOREIGN PATENT DOCUMENTS:
"01220328 9/1989 Japan" should read
--1-220328 9/1989 Japan--.

Title page, item [57]

Line 17, "lease" should read --least--.

COLUMN 5

LIne 2, "Junction" should read --junction--.

COLUMN 10

Line 49, "and" should read --an--.

Signed and Sealed this

Fifth Day of September, 1995

Attest:

BRUCE LEHMAN

*Attesting Officer*

*Commissioner of Patents and Trademarks*